United States Patent [19]

Wine

[11] 4,317,050

[45] Feb. 23, 1982

[54] USER CONTROL ARRANGEMENT FOR CONTROLLING A PLURALITY OF FUNCTIONS

[75] Inventor: Charles M. Wine, Princeton, N.J.

[73] Assignee: RCA Corporation, New York, N.Y.

[21] Appl. No.: 84,714

[22] Filed: Oct. 15, 1979

[51] Int. Cl.³ .......................... H03K 17/56; H04N 5/44
[52] U.S. Cl. .................................... 307/541; 307/243; 307/224 R; 358/188; 340/825.25
[58] Field of Search .................... 358/21, 27, 28, 168, 358/191.1, 188, 151, 179; 455/353, 354; 307/445, 241, 243; 340/171, 224; 329/103, 124, 87

[56] References Cited

U.S. PATENT DOCUMENTS

| 3,854,123 | 12/1974 | Banach | 358/191.1 |
| 3,866,112 | 2/1975 | Yokoyama et al. | 307/243 |
| 3,886,307 | 5/1975 | Evans et al. | 358/188 |

OTHER PUBLICATIONS

Electronic Engineering, "A Push Switch Operated, Priority Data Selector," p. 31, 7/76.
"Direct Address Television Tuning and Display System Using Digital MOS Large Scale Integration" by W. W. Evans et al., IEEE Transactions on Consumer Electronic, vol. CE-22, No. 4, pp. 267–287, 11/76.

Primary Examiner—Stanley D. Miller, Jr.
Assistant Examiner—B. P. Davis
Attorney, Agent, or Firm—E. M. Whitacre; P. M. Emanuel

[57] ABSTRACT

User control apparatus for a system such as a television receiver having a plurality of user controllable functions such as channel, volume, brightness, contrast, color saturation and tint, includes a plurality of individual pushbuttons for changing respective functions in a first sense, e.g., "up" and a common pushbutton for changing all of the functions in a second sense, e.g., "down". Operation of one of the individual pushbuttons selects the function to be controlled and causes the function to be increased. Thereafter, operation of the common pushbutton causes the selected function to be decreased.

6 Claims, 1 Drawing Figure

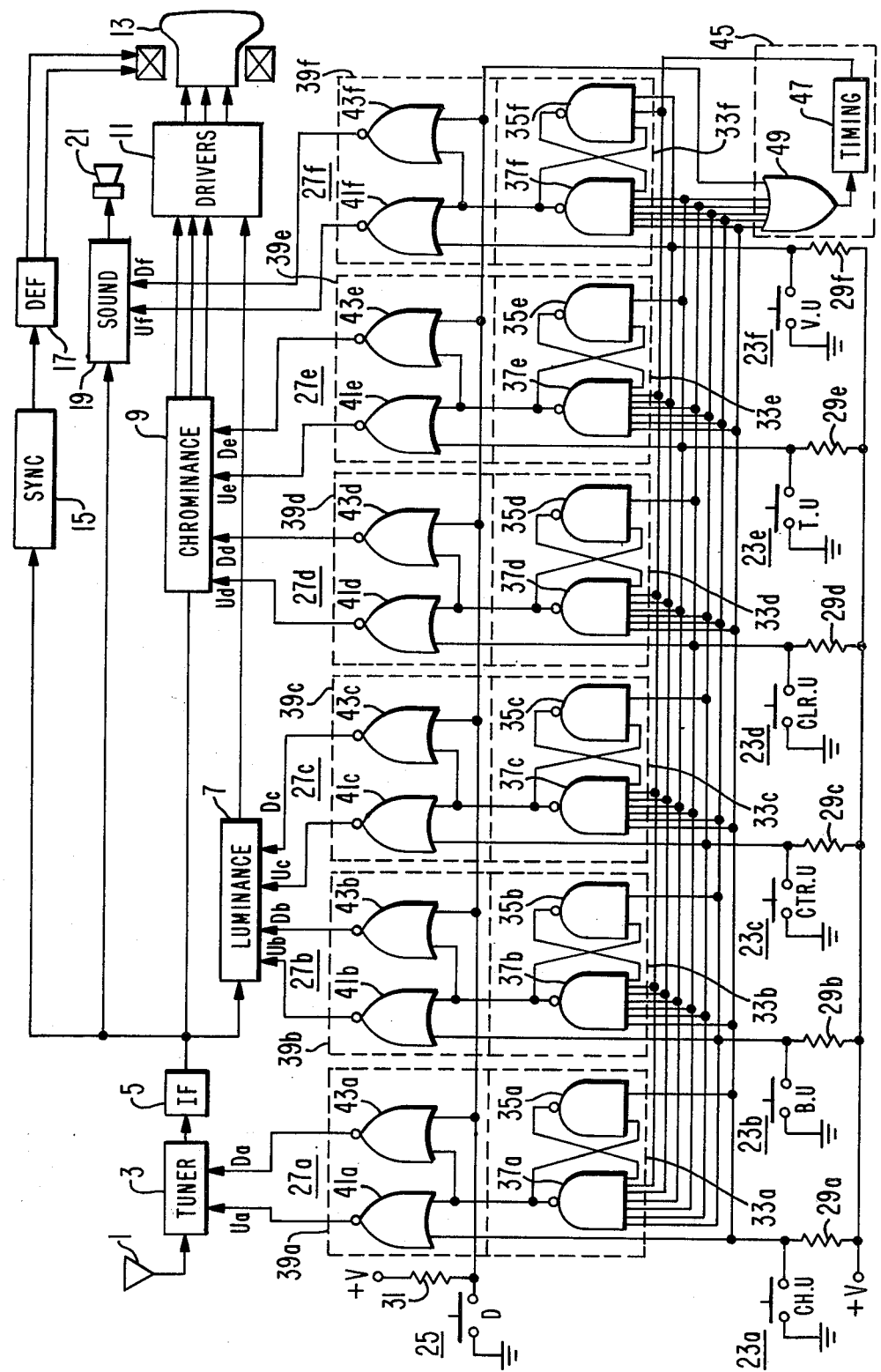

USER CONTROL ARRANGEMENT FOR CONTROLLING A PLURALITY OF FUNCTIONS

BACKGROUND OF THE INVENTION

The present invention relates to the field of user control apparatus for generating command signals to control each of a plurality of functions of a system in two opposite senses.

There are many systems in which functions or properties of the systems are controlled in response to a user's operation of switches. For example, in a television receiver pairs of switches may be provided to increase and decrease the channel number of the channel to which the receiver is tuned, the volume level of the receiver and certain picture properties of the receiver such as brightness, contrast, color saturation and color tint. The arrangement least confusing to a user employs two switches for each function, i.e., an "up" switch for increasing the function and a "down" switch for decreasing the function. In mathematical terms, this arrangement requires 2 N switches, where N is equal to the number of functions to be controlled.

To reduce the cost and increase the reliability of the systems employing switches to control analog functions, arrangements which employ less than 2 N switches are desired. One prior arrangement for reducing the number of required switches includes a single common "up" switch, a single common "down" switch, and one function selection switch for each of functions to be controlled. In mathematical terms, this arrangement requires 2+N switches. The number of required switches may be further reduced by deleting one of the function switches if apparatus is provided for automatically enabling the up and down switches to be used to control the function associated with the deleted switch at a predetermined time delay after one of the other functions has been controlled. The resulting arrangement requires 2+(N-1) or 1+N switches.

While the arrangements described above reduce the number of switches required, they tend to be more confusing to the user than the arrangement with an "up" and "down" for each function.

SUMMARY OF THE PRESENT INVENTION

The present invention concerns a user control arrangement which requires only 1+N switches, but which is less confusing to operate than the arrangement described above. Specifically, the present invention concerns a user control arrangement comprising a plurality of individual switches, equal in number to the number of functions to be controlled, for selecting the function to be controlled and also for changing the selected function in a first, e.g., increasing sense and a single common switch for changing all of the functions, when selected by means of the individual switches, in a second, e.g., decreasing, sense.

BRIEF DESCRIPTION OF THE DRAWING

The sole FIGURE of the drawing is a schematic diagram, partially in block form, of an implementation of the present invention as it may be employed in a color television receiver to control various functions of the receiver.

DETAILED DESCRIPTION OF THE DRAWING

Referring to the sole FIGURE, an RF signal source, shown as an antenna 1, provides RF signals in the television band to a tuner 3 of a color television receiver. Tuner 3 selects one of the RF signals and heterodynes it with an internally generated local oscillator to derive an IF signal. The IF signal contains luminance, chrominance, synchronization and sound components. The IF signal is filtered and amplified by an IF processing unit 5. The luminance component is processed by a luminance processing unit 7 to produce a luminance signal. The chrominance component of the IF signal is processed by a chrominance processing unit 9 to derive red, green and blue color difference signals. The color difference signals are combined with the luminance signal in respective drivers 11 to derive red, green and blue color signals. A kinescope 13 generates three respective electron beams in response to the color signals. The synchronization components of the IF signal are processed by a "sync" separator 15 to derive horizohtal and vertical synchronization pulses. The synchronization pulses are processed by a deflection unit 17 to form vertical and horizontal deflection signals. The deflection signals cause the electron beams to be scanned across the phosphor deposited on the inside surface of the screen of kinescope 13 in raster fashion to produce a color image. The sound component of the IF signal is processed by a sound processing unit 19 to derive an audio signal. The audio signal is converted to an audible response by a speaker 21.

Each of tuner 3, luminance processing unit 7, chrominance processing unit 9 and sound processing unit 19 include voltage-controlled portions for controlling respective receiver functions or properties. To determine the channel to which the receiver is tuned, tuner 3 includes voltage-controlled tuned circuits (not specifically shown) for selecting a particular one of the RF carriers applied to it from antenna 1 and a voltage-controlled local oscillator (not specifically shown) for generating the local oscillator signal and for controlling its frequency. To control the brightness of the picture, luminance processing unit 7 includes a DC level insertion unit or "clamp" (not specifically shown) for controlling the DC level of the luminance signal. To control the contrast of the picture, luminance processing unit 7 includes a voltage-controlled amplifier (not specifically shown) for controlling the amplitude of the luminance signal. To control the color saturation of the picture, chrominance processing unit 9 includes a voltage-controlled amplifier (not specificallyshown) to control the amplitude of the color signals. To control the color tint or hue of the picture, chrominance processing unit 9 includes a voltage-controlled phase shifting unit (not specifically shown) to control the relative phase relationships of the color signals. To control the volume level, sound processing unit 19 includes a voltage-controlled amplifier (not specifically shown) for controlling the amplitude of the audio signal.

Tuner 3, luminance processing unit 7, chrominance processing unit 9 and sound processing unit 19 include digital-to-analog converters (not specifically shown) for generating DC control voltages for controlling the respective voltage-controlled portions in response to binary signals stored in respective up/down counters (not specifically shown). Each of the counters is responsive to a U (Up) command signal for changing its contents so as to increase the respective function and a D (Down) command signal for changing its contents so as to decrease the respective function.

The portions of the receiver so far described are well known in the television art and need not be described in further detail. The remaining portion of the receiver, with which the present invention is concerned, comprises the user control apparatus by which a user effects the generation of the U and D command signals for each of the channel selection, picture brightness, picture contrast, color saturation, color tint and volume level functions or properties.

The present user control apparatus includes only seven push-button switches to generate the U and D command signals for each of the six receiver functions enumerated above. Six individual pushbutton switches 23a–23f, labelled CH. U (Channel Up), B.U. (Brightness Up), CTR. U. (Contrast Up), CLR. U. (Color Up), T.U. (Tint Up), and V.U. (Volume Up), are provided to select the function to be controlled and to increase the selected function. A single common "down" pushbutton switch 25, labelled D, is provided to decrease the functions once selected by means of respective ones of individual pushbutton switches 23a–23f.

Each of pushbuttons 23a–23f and 25 includes two normally opened contacts and a mechanism (not specifically shown) for closing the contacts when a pushbutton is depressed. When the pushbutton is released, the mechanism causes the switch to return to its normally opened condition. Logic circuits 27a–27f detect the closure of pushbutton switches 23a–23f and 25 to generate the respective command signals Ua–Uf and Da–Df. When the contacts of pushbutton switches 23a–23f and 25 are opened, logic high levels are developed at respective inputs of logic circuits 27a–27f by virtue of the connections of respective pull-up resistors 29a–29f and 31 to a point of positive voltage +V. When the contacts of pushbutton switches 23a–23f and 25 are closed, logic low or "0" levels are applied to respective inputs of logic circuits 27a–27f by virtue of respective connections to signal ground provided by the closed contacts.

Since logic circuits 27a–27f are all substantially the same, only logic circuit 27a associated with pushbutton switch 23a (CH. U) will be described in detail. To facilitate the understanding of logic circuits 27b–27f by analogy to logic circuit 27a, respective components are identified by similar reference designations.

Logic circuit 27a includes a set-reset flip-flop 33a comprising two cross-coupled NAND gates 35a and 37a and an output circuit 39 comprising two NOR gates 41a and 43a. If none of pushbuttons 23a–23f have been depressed, flip-flip 33a is in a reset condition in which the output of NAND gate 35a is at the high level and the output of NAND gate 37a is at the low level. Since both inputs of NOR gates 41a and 43a are at the high level, the output of each, i.e., Ua and Da respectively, is at the low level. As a result, the contents of the counter in tuner 3 remains unchanged.

If pushbutton switch 23a is depressed, a low level is applied to the input of NAND gate 35a connected to pushbutton switch 23a and flip-flop 33a is caused to be in a set condition in which the output of NAND gate 35a is at a high level and the output of NAND gate 37a is at the low level. When pushbutton switch 23a is depressed, the resulting low level signal also causes each of flip-flops 33b–33f to be in a reset condition. At this point the channel selection function has been selected or enabled to be controlled and the remaining functions have been disabled from being controlled. In addition, since at this point, both inputs of NOR gate 41a are at the low level, the output of NOR gate 41a, i.e., Ua, is caused to be at the high level and the contents of the counter in tuner 3 are caused to change so as to increase the channel number.

Thereafter, as long as flip-flop 33a remains set, the channel selection function is enabled to be increased or decreased because of the low level applied to one input of each of NOR gates 41a and 43a by NAND gate 37a. As a result, when common down pushbutton switch 25 is depressed and the low level is applied to the input of NOR gate 43a connected to pushbutton switch 25, since, at this point, both inputs of NOR gate 43a are at the low level, the output of NOR gate 43a, i.e., Da, is caused to be at the high level and the contents of the counter in tuner 3 are caused to change so as to decrease the channel number. Flip-flop 33a is reset when one of the other pushbuttons 23b–23f are depressed and the low logic level is applied to the input of NAND gate 37a connected to the pushbutton switch which has been depressed.

With the user control apparatus so far described, it is necessary to select the function by depressing the respective one of "up" pushbutton switches 23a–23f before the function may be decreased by depressing common "down" pushbutton switch 25. Since a particular function, e.g., the sound level, may be controlled by a user more frequently than other functions, it may be desirable for the user control apparatus to give priority to the control of the most frequently controlled function. To this end a logic circuit 45 is provided to automatically return the user control apparatus to a condition in which the volume level may be decreased by depressing common "down" pushbutton switch 25 without having first to select the "volume" function by depressing pushbutton switch 23f at a predetermined time delay after another function has been controlled.

Logic circuit 45 includes a retriggerable timing circuit 47 which normally develops a high level and which, at a predetermined time delay, e.g., 5 seconds after the application of a positive-going pulse or edge to its input, develops a relatively short duration, e.g., 1 millisecond, negative-going pulse. Timing circuit 47 may comprise two retriggerable monostable multivibrators (not specifically shown) having their inputs connected together as the input of timing circuit 47 and an AND gate (not specifically shown) for combining the output signals of the two monostable multivibrators to form the output signal of timing circuit 47. The time durations of the output signals of the monostable multivibrators are selected to determine the leading and trailing edges of the negative-going output signal of timing circuit 47. Logic circuit 45 also includes an OR gate 49 having inputs connected to individual up pushbutton switches 23a–23e and common down pushbutton switch 25 for applying the trigger input signal to timing circuit. The output of timing circuit 47 is connected to each of NAND gates 37a–37e and NAND gate 35f.

Since the output signal of timing circuit 47 is normally at the high level, the control of any of the functions can be initiated by depressing the respective one of individual pushbutton switches 23a–23f. When one of pushbutton switches 23a–23e previously depressed is released, a positive-going edge is applied to the respective input of OR gate 49 and, as a result, a positive-going edge is applied by OR gate 49 to the input of timing circuit 49. At the predetermined time delay after the generation of the positive-going edge by OR gate 49, timing circuit 47 generates a negative-going pulse which is applied to respective inputs of NAND gates 37a–37e and to NAND gate 35f. In response, each of flip-flops 29a–29e is caused to be in its reset condition and NAND gate is caused to be in its set condition. Accordingly, the control of each of the functions except the volume level is disabled and the control of volume level is enabled. Thereafter since the control of the volume level is enabled, the volume may be decreased without having first to depress pushbutton switch 29f.

In summary, what has been described is a user control apparatus for controlling N functions or properties of a system with only 1+N switches including of N individual switches for both selecting the function to be controlled and causing the selected function to change in a first, e.g., increasing, sense and a single common switch for causing all of the functions, when selected by means of a respective individual switch, to change in a second, e.g., decreasing, sense. While in the control apparatus described, the individual switch causes the functions to increase and the common switch causes the functions to decrease, it will be appreciated that senses of change associated with the individual switches and the common switch may be reversed. However, it is believed that because users have a propensity to first increase functions rather than decrease functions, there is some advantage in having the individual switches cause respective functions to increase. In addition, while the present user control apparatus was described in terms of a particular discrete logic implementation, it will be appreciated that other discrete logic implementations are possible. Moreover, it is possible for a microprocessor under the control of a program stored in digital form in an associated memory to be utilized in place of discrete logic. Further, while the present user control apparatus has been described in terms of apparatus which is to be physically attached to and electrically connected to the system to be controlled, it will be appreciated that it may be employed in remote control arrangements. These and other modifications are intended to be included with the scope of the present invention as defined by the following claims.

What I claim is:

1. In a system including means for increasing and decreasing a plurality of functions or properties in response to respective pairs of "up" and "down" command signals, user control apparatus comprising:
   a plurality of individual function switches each for both selecting a respective individual function to be controlled and changing its sense in a predetermined sense;
   a single common switch for changing all of said functions in the sense opposite to said predetermined sense; and
   a plurality of command signal generating means each for generating a predetermined one of a respective pair of said "up" and "down" command signals in response to the operation of a respective one of said individual function switches and for generating the other one of said respective pair of said "up" and "down" command signals when said respective one of said individual function switches and said common switch are both operated.

2. The apparatus recited in claim 1 wherein:
   each of said command signal generating means generates said predetermined one of said respective pair of said command signals in response to the operation of said respective one of said individual function switches and generates said other one of said respective pair of said command signals in response to the operation of said respective one of said individual function switches followed by the operation of said common switch.

3. The apparatus recited in claim 2 wherein:
   each of said command signal generating means generates said respective "up" command signal in response to the operation of said respective one of said individual function switches and generates said respective "down" command signal in response to the operation of said respective one of said individual function switches followed by the operation of said common switch.

4. The apparatus recited in claim 2 wherein:
   each of said individual function switches generates a respective "first" signal when operated;
   said common switch generates a "second" signal when operated; and
   each of said command signal generating means includes first means for generating an "enabling" signal in response to the respective one of said "first" signals and second means for generating said predetermined one of said respective pair of said command signals in response to said "enabling" signal and the respective one of said "first" signals and for generating said other one of said respective pair of said "up" and "down" signals in response to said "enabling" signal and said "second" signal.

5. The apparatus recited in claim 4 wherein:
   each of said first means includes resetting means for ending said respective "enabling" signal in response to any one of said "first" signals other than said respective "first" signal.

6. The apparatus recited in claim 5 further including:
   priority means for generating the "enabling" signal for a predetermined one of said second means at a predetermined time after the end of any of said "first" signals other than a respective "first" signal or said "second" signal.

* * * * *